(12) United States Patent
Kazue et al.

(10) Patent No.: US 10,424,548 B2
(45) Date of Patent: Sep. 24, 2019

(54) METHOD OF MANUFACTURING SEMICONDUCTOR DEVICE

(71) Applicant: CANON KABUSHIKI KAISHA, Tokyo (JP)

(72) Inventors: Yuichi Kazue, Tokyo (JP); Takahiro Hachisu, Isehara (JP); Hidemasa Oshige, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/711,589

(22) Filed: Sep. 21, 2017

(65) Prior Publication Data
US 2018/0090453 A1    Mar. 29, 2018

(30) Foreign Application Priority Data

Sep. 28, 2016   (JP) .................................. 2016-189209

(51) Int. Cl.
*H01L 23/00* (2006.01)
*H01L 21/02* (2006.01)
(Continued)

(52) U.S. Cl.
CPC ...... *H01L 23/562* (2013.01); *H01L 21/02076* (2013.01); *H01L 21/6835* (2013.01);
(Continued)

(58) Field of Classification Search
CPC . H01L 21/78; H01L 21/7806; H01L 21/7813; H01L 21/782; H01L 21/784;
(Continued)

(56) References Cited

U.S. PATENT DOCUMENTS 6,136,668 A *  10/2000  Tamaki ................... H01L 21/78
                                                        257/E21.238
7,518,217 B2    4/2009   Fujita et al.
(Continued)

FOREIGN PATENT DOCUMENTS

JP        5-335292 A     12/1993
JP         7-6982 A      1/1995
(Continued)

OTHER PUBLICATIONS

Oshige, U.S. Appl. No. 15/800,567, filed Nov. 1, 2017.
JP 2010-238729, 2010/0248425 A1.
JP 4696595, U.S. Pat. No. 7,518,217 B2.

*Primary Examiner* — Edward Chin
(74) *Attorney, Agent, or Firm* — Venable LLP

(57) ABSTRACT

According to one aspect of the present invention, a method of manufacturing a semiconductor device is provided, which includes a bonding step bonding a semiconductor substrate having a semiconductor element disposed on a first surface, to a support substrate, at least through an adhesive layer between the semiconductor substrate and the support substrate, and a groove forming step forming a groove in a scribe area of the semiconductor substrate, from a side of a second surface of the semiconductor substrate, the second surface being opposite to the first surface, and in the groove forming step, a conductive layer between the semiconductor substrate and the support substrate is exposed at a bottom of the groove, without the adhesive layer being exposed in the groove.

13 Claims, 8 Drawing Sheets

(51) Int. Cl.
*H01L 21/683* (2006.01)
*H01L 21/768* (2006.01)
*H01L 21/78* (2006.01)
*H01L 23/48* (2006.01)
*H01L 23/544* (2006.01)

(52) U.S. Cl.
CPC ........ *H01L 21/76898* (2013.01); *H01L 21/78* (2013.01); *H01L 23/481* (2013.01); *H01L 23/544* (2013.01); *H01L 2221/6834* (2013.01); *H01L 2221/68327* (2013.01); *H01L 2221/68372* (2013.01); *H01L 2223/5446* (2013.01)

(58) Field of Classification Search
CPC . H01L 21/786; H01L 23/562; H01L 21/6835; H01L 21/76898; H01L 23/481; H01L 21/02076; H01L 23/544; H01L 2221/6834; H01L 2221/68327; H01L 2223/5446; H01L 2221/68372
See application file for complete search history.

(56) References Cited

U.S. PATENT DOCUMENTS

| | | | |
|---|---|---|---|
| 2004/0266051 | A1 | 12/2004 | Kojima et al. |
| 2006/0014320 | A1* | 1/2006 | Yamano .................. H01L 24/11 |
| | | | 438/113 |
| 2009/0256260 | A1* | 10/2009 | Nakamura ........ H01L 27/14618 |
| | | | 257/758 |
| 2009/0283311 | A1 | 11/2009 | Ida |
| 2010/0248425 | A1* | 9/2010 | Hashimoto ............. H01L 21/78 |
| | | | 438/113 |

FOREIGN PATENT DOCUMENTS

| | | |
|---|---|---|
| JP | 2005-268238 A | 9/2005 |
| JP | 2010-238729 A | 10/2010 |
| JP | 4696595 B2 | 6/2011 |
| WO | 2015/111419 A2 | 7/2015 |

\* cited by examiner

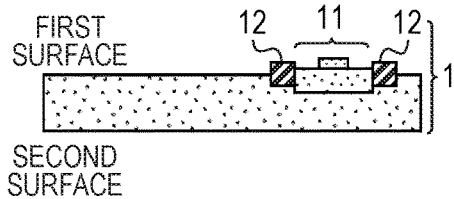
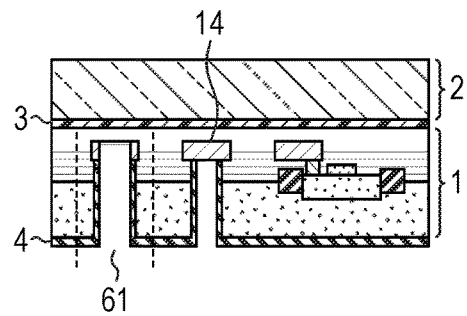
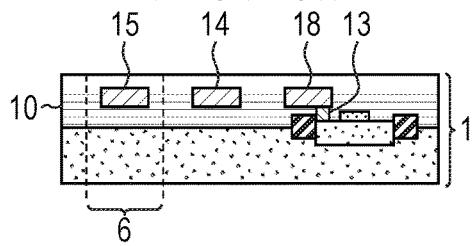
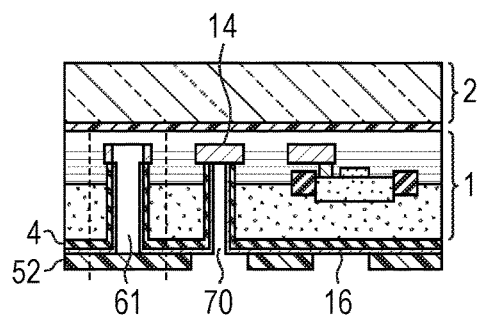
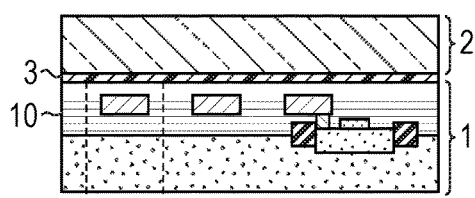
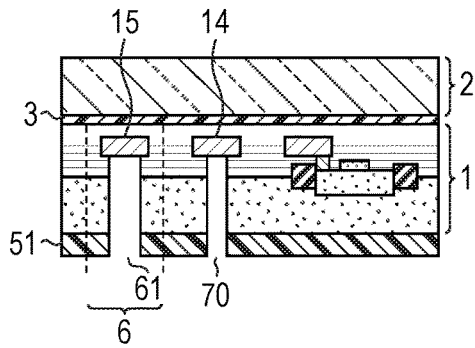
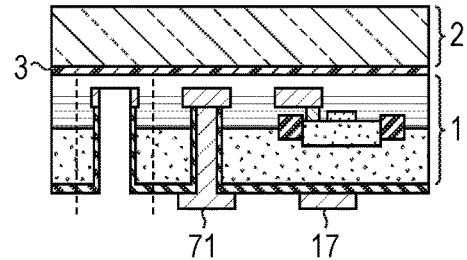
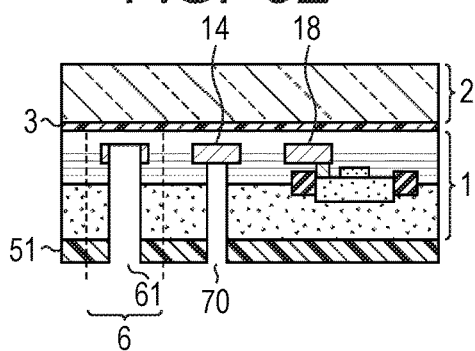
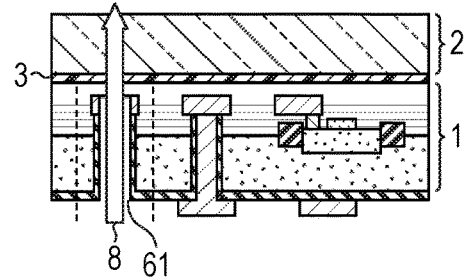

METHOD OF MANUFACTURING SEMICONDUCTOR DEVICE

BACKGROUND OF THE INVENTION

Field of the Invention

The present invention relates a method of manufacturing a semiconductor device having a structure in which two kinds of different substrates are bonded.

Description of the Related Art

As one of semiconductor packaging technologies, a wafer-level chip-size package (WLCSP) is known. The WLCSP is a technique to package a wafer and cut and dice the wafer into semiconductor devices. Generally, the WLCSP includes a step of bonding a semiconductor substrate having a semiconductor element formed on a surface thereof to a support substrate through an adhesive layer. However, such a semiconductor substrate and support substrate often have different coefficients of thermal expansion, and the semiconductor substrate sometimes warps upon bonding. This warpage causes insufficient suction of the semiconductor substrate onto a wafer stage or the like in a subsequent step such as dicing, and manufacturing yield decreases disadvantageously.

In order to solve such a problem, for example, in Japanese Patent Application Laid-Open No. 2010-238729, stress relief grooves are formed along grid lines for cutting out and dicing semiconductor devices to inhibit warpage caused by bonding, for improved yield.

However, as described in Japanese Patent Application Laid-Open No. 2010-238729, etching the stress relief grooves along the grid lines to a level of a support substrate causes exposure of an adhesive layer before an insulating film is deposited along the stress relief grooves. Normally, a cleaning step is performed after etching a stress relief grooves and before deposition of an insulating film, but the above configuration may cause intrusion of chemical or water from the exposed adhesive layer into a semiconductor substrate, and deterioration of an electrical characteristic of the semiconductor device.

SUMMARY OF THE INVENTION

According to one aspect of the present invention, a method of manufacturing a semiconductor device is provided, which includes a bonding step bonding a semiconductor substrate having a semiconductor element disposed on a first surface, to a support substrate, at least through an adhesive layer between the semiconductor substrate and the support substrate, and a groove forming step forming a groove in a scribe area of the semiconductor substrate, from a side of a second surface of the semiconductor substrate, the second surface being opposite to the first surface, and in the groove forming step, a conductive layer between the semiconductor substrate and the support substrate is exposed at a bottom of the groove, without the adhesive layer being exposed in the groove.

Furthermore, according to another aspect of the present invention, a method of manufacturing a semiconductor device is provided, which includes a bonding step bonding a semiconductor substrate having a semiconductor element disposed on a first surface, to a support substrate, at least through an adhesive layer between the semiconductor substrate and the support substrate, and a groove forming step forming a groove from a side of a second surface of the semiconductor substrate, the second surface being opposite to the first surface, and in the groove forming step, the groove is formed to reach an insulating layer between the semiconductor substrate and the adhesive layer, without the adhesive layer being exposed in the groove.

Furthermore, according to still another aspect of the present invention, a method of manufacturing a semiconductor device is provided, which includes a bonding step bonding a semiconductor substrate having a semiconductor element disposed on a first surface, to a support substrate, at least through an adhesive layer between the semiconductor substrate and the support substrate, a groove forming step forming a groove from a side of a second surface of the semiconductor substrate, the second surface being opposite to the first surface, and a step of forming a through-via by filling a hole disposed in the semiconductor substrate with a conductive material after masking the groove, wherein, in the forming the groove, the groove is formed without the adhesive layer being exposed in the groove.

Further features of the present invention will become apparent from the following description of exemplary embodiments with reference to the attached drawings.

BRIEF DESCRIPTION OF THE DRAWINGS

FIGS. 8A, 8B, 8C, 8D, 8E, 8F, 8G, 8H and 8I are schematic diagrams illustrating a method of manufacturing a semiconductor device according to the fourth embodiment.

DESCRIPTION OF THE EMBODIMENTS

Preferred embodiments of the present invention will now be described in detail in accordance with the accompanying drawings.

(First Embodiment)

Figure 1:
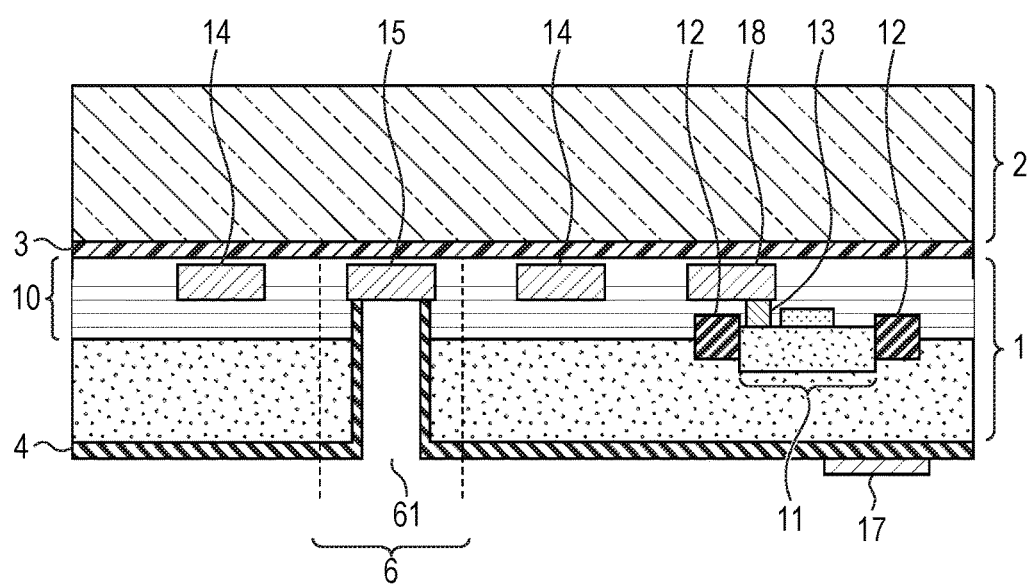
FIG. 1 is a schematic diagram illustrating a cross-sectional structure of a semiconductor device according to a first embodiment.

FIG. 1 is a schematic diagram illustrating a cross-sectional structure of a semiconductor device according to a first embodiment. As illustrated in FIG. 1, the semiconductor device according to the present embodiment has a structure in which a semiconductor substrate 1 and a support substrate 2 are bonded through an adhesive layer 3. Here, the semiconductor substrate 1 may be, for example, a semiconductor substrate including silicon or the like, and the support substrate 2 may be, for example, a transparent plate. However, materials of the semiconductor substrate 1 and the support substrate 2 are not limited thereto.

In the semiconductor substrate 1, a semiconductor element 11, such as a MOS transistor, is disposed. An element separation portion 12, such as shallow trench isolation (STI), may be further formed in the semiconductor substrate 1. This element separation portion 12 electrically separates the semiconductor element 11 from another element.

The semiconductor substrate 1 has a surface (hereinafter, referred to as "first surface"), near the adhesive layer 3, on which an interlayer insulating layer 10 is formed to insulate the semiconductor element 11 from the adhesive layer 3 or the like. The interlayer insulating layer 10 has a plurality of insulating layers, and a wiring layer 18 is disposed among the insulating layers. The plurality of insulating layers of the interlayer insulating layer 10 mainly includes silicon oxide, and silicon carbide, silicon nitride, or the like may be incidentally used. A contact hole 13 includes a metal such as tungsten, and the semiconductor element 11 and the wiring layer 18 are electrically connected. Barrier metal, not illustrated, including titanium, tantalum, or a nitride thereof may be further provided in the interlayer insulating layer 10 to prevent diffusion of metal in the semiconductor substrate 1.

The semiconductor substrate 1 has a surface (hereinafter, referred to as "second surface"), on a side opposite to the first surface, on which an insulating film is formed to maintain insulation property of the semiconductor substrate 1. As the insulating film 4, an insulating material, such as silicon oxide or silicon nitride, may be used. A metal wire 17 or the like may be further provided on a surface of the insulating film 4.

As illustrated in FIG. 1, the semiconductor device according to the present embodiment includes a stress relief groove 61 for stress release. Therefore, warpage of the semiconductor device caused by a difference in coefficient of thermal expansion between the semiconductor substrate 1 and the support substrate 2 can be reduced. The stress relief groove 61 illustrated in FIG. 1 is formed in a scribe area 6 between semiconductor chips, and also has function as a dicing groove, but the stress relief groove 61 may be formed as a groove dedicated to stress release. Furthermore, the stress relief groove 61 can be also used as a hole for a through-via (not illustrated) as described in a second embodiment.

Furthermore, the semiconductor device according to the present embodiment includes an etching stopper layer 15 in the interlayer insulating layer 10. The etching stopper layer 15 prevents etching of the stress relief groove 61 beyond the etching stopper layer 15 to the adhesive layer 3. Thus, as illustrated in FIG. 1, since the stress relief groove 61 is formed to prevent exposure of the adhesive layer from the stress relief groove 61, warpage of the semiconductor substrate 1 can be inhibited while preventing moisture absorption from the adhesive layer 3, and yield can be improved.

The etching stopper layer 15 includes, for example, metal such as copper or aluminum, and typically, the wiring layer 18 as a conductive layer formed among the insulating layers of the interlayer insulating layer 10 is also used as an etching stopper layer 15. Furthermore, when the stress relief groove 61 is used as the hole for a through-via, an electrode portion 14 as a conductive layer for connecting a through-via to the wiring layer 18 can be also used as an etching stopper layer 15. The electrode portion 14 and the etching stopper layer 15 may be formed of the same material or different materials. Furthermore, the electrode portion 14 and the etching stopper layer 15 may be formed in the same wiring layer 18, or may be formed in different wiring layers 18.

Hereinafter, a method of manufacturing a semiconductor device illustrated in FIG. 1 will be described with reference to FIGS. 2A to 2F. In the following steps, a known semiconductor manufacturing process can be used as necessary, and between steps, heat treatment, cleaning, or the like can be performed. Description of a known technology may be sometimes omitted.

Figure 2A:
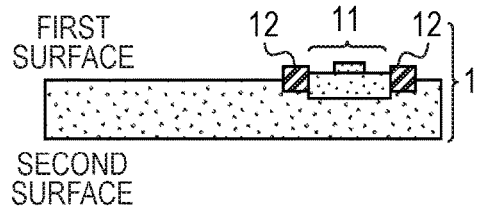
FIGS. 2A, 2B, 2C, 2D, 2E and 2F are schematic diagrams illustrating a method of manufacturing a semiconductor device according to the first embodiment.

FIG. 2A is a schematic diagram illustrating a step of forming the semiconductor element 11 in the semiconductor substrate 1, in the method of manufacturing a semiconductor device according to the first embodiment. In the step illustrated in FIG. 2A, the semiconductor element 11, such as a MOS transistor, is formed in the first surface of the semiconductor substrate 1. The element separation portion 12 or the like may be further formed in the semiconductor substrate 1.

Figure 2B:
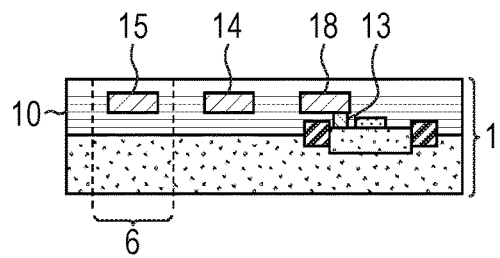

FIG. 2B is a schematic diagram illustrating a step of forming the interlayer insulating layer 10 in the semiconductor substrate 1, in the method of manufacturing a semiconductor device according to the first embodiment. In the step illustrated in FIG. 2B, the interlayer insulating layer 10 having the wiring layer 18 is formed on the first surface being a surface, of the semiconductor substrate 1, on a side on which the semiconductor element 11 is formed. At this time, in the scribe area 6, the etching stopper layer 15 is formed among the plurality of insulating layers of the interlayer insulating layer 10. In the interlayer insulating layer 10, a conductive member, such as the contact hole 13, may be further formed to electrically connect the semiconductor element 11 and the wiring layer 18. Furthermore, the electrode portion 14 for connecting the through-via, not illustrated, and the wiring layer 18 may be further formed in the interlayer insulating layer 10.

In the present example, first, subatmospheric CVD was used to form a boron-phosphorus silicon glass (BPSG) film on the first surface of the semiconductor substrate 1. Furthermore, a contact plug in which a conductive material, such as tungsten, was filled was formed as the contact hole 13. Next, a conductive material, such as aluminum, was deposited by a sputtering method, and then patterning was performed by dry etching to form the wiring layer 18. Furthermore, the etching stopper layer 15 was formed in the scribe area 6 by a similar method. Then, silicon oxide was used to form the interlayer insulating layer 10 on the wiring layer 18 and the etching stopper layer 15, by plasma CVD.

Figure 2C:
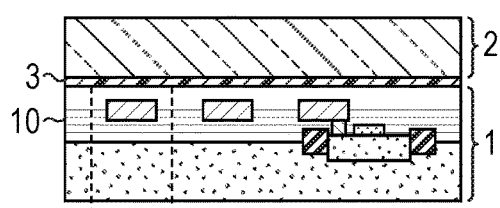
Figure 2D:
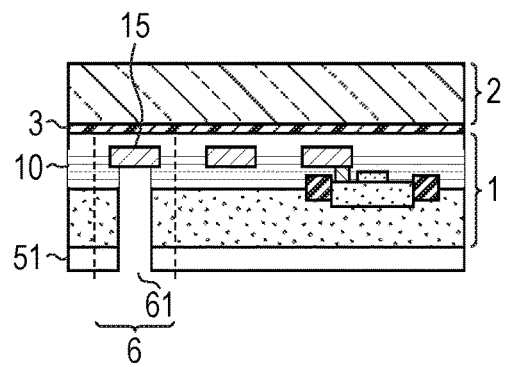

FIG. 2C is a schematic diagram illustrating a step of bonding the semiconductor substrate 1 and the support substrate 2 through the adhesive layer 3, in the method of manufacturing a semiconductor device according to the first embodiment. In the step illustrated in FIG. 2C, after the adhesive layer 3 is formed on the interlayer insulating layer 10 of the semiconductor substrate 1, a transparent plate as the support substrate 2 is bonded to the adhesive layer 3. Then, the semiconductor substrate 1 may be reduced in thickness by back grind if necessary. In the present example, after quartz glass having a thickness of 0.5 mm, as the support substrate 2, was bonded to the semiconductor substrate 1 with an adhesive, the thickness of the semiconductor substrate 1 was reduced to 0.2 mm by back grind FIG. 2D is a schematic diagram illustrating a step of forming the stress relief groove 61 in the semiconductor substrate 1, in the method of manufacturing a semiconductor device according to the first embodiment. In the step illustrated in FIG. 2D, after a pattern of a first mask 51 is formed on a second surface of the semiconductor substrate 1, etching is performed from a side of the second surface of the semiconductor substrate 1 to form the stress relief groove 61 in the scribe area 6.

Since the semiconductor device according to the present embodiment includes the etching stopper layer 15 in the interlayer insulating layer 10, the stress relief groove 61 is formed from the second surface of the semiconductor substrate 1 to the etching stopper layer 15. Thus, the warpage of the semiconductor substrate 1 can be inhibited while preventing moisture absorption from the adhesive layer 3, and the yield can be improved. The stress relief groove 61 can be also used as a scribe groove.

In the present example, before the stress relief groove 61 reached the interlayer insulating layer 10, a so-called Bosch process was used to vertically etch the semiconductor substrate 1. After the stress relief groove 61 reached the depth of the interlayer insulating layer 10, the interlayer insulating layer 10 was subjected to dry etching to extend the stress relief groove 61 to the etching stopper layer 15. At this time, for the dry etching of the interlayer insulating layer 10 anisotropic etching, such as capacitive coupled plasma RIE, using a mixed gas including $CF_4$, $C_4F_8$, $O_2$, Ar, or the like was employed. Note that, in the present example, a resist was used as the first mask 51 to readily remove the first mask 51 later, but as the first mask 51, for example, an inorganic substance or the like may be employed.

Figure 2E:
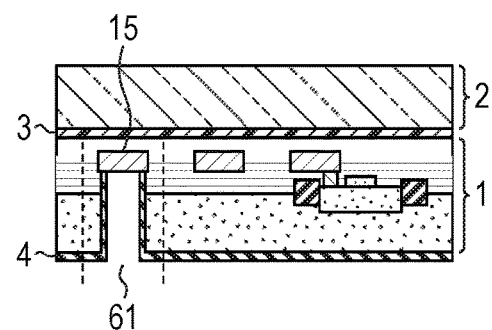

FIG. 2E is a schematic diagram illustrating a step of forming the insulating film 4 on the semiconductor substrate 1, in the method of manufacturing a semiconductor device according to the first embodiment. In the step illustrated in FIG. 2E, the insulating film 4 is formed over the second surface of the semiconductor substrate 1, including side surfaces of the stress relief groove 61. As the insulating film 4, an insulating material, such as silicon oxide or silicon nitride, may be used.

In the present example, the insulating film 4 of silicon oxide having a thickness of 1.5 μm was formed on the second surface of the semiconductor substrate 1 by plasma CVD. Then, an insulating film 4 on the etching stopper layer 15 was removed by etch back using anisotropic etching, such as capacitive coupled plasma RIE, using a mixed gas including $CF_4$, $C_4F_8$, $O_2$, Ar, or the like.

Figure 2F:
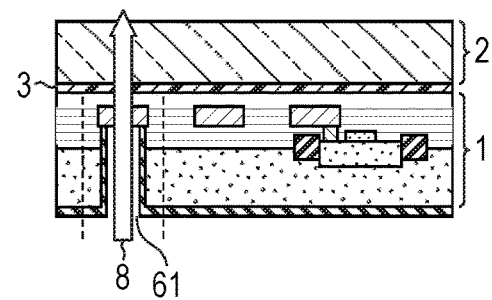

FIG. 2F is a schematic diagram illustrating a dicing step, in the method of manufacturing a semiconductor device according to the first embodiment. In the step illustrated in FIG. 2F, a known semiconductor manufacturing process is used to perform application of a solder resist and arrangement of a solder ball, and perform the step of dicing 8 or the like along the stress relief groove 61 also used as the scribe groove, and manufacture of the semiconductor device is completed.

As described above, the method of manufacturing a semiconductor device according to the present embodiment includes a bonding step of bonding the semiconductor substrate having a semiconductor element disposed on the first surface to the support substrate at least through the adhesive layer. Furthermore, the method of manufacturing a semiconductor device according to the present embodiment includes a groove forming step of forming a groove in a scribe area of the semiconductor substrate, from the side of the second surface of the semiconductor substrate, opposite to the first surface, to prevent exposure of the adhesive layer. Thus, the scribe groove can be formed which inhibits the warpage of the semiconductor substrate while preventing moisture absorption from the adhesive layer to improve the yield, and is also used as a stress relief groove.

Furthermore, another method of manufacturing a semiconductor device according to the present embodiment includes a bonding step of bonding the semiconductor substrate having a semiconductor element disposed on the first surface to the support substrate at least through the adhesive layer. Furthermore, the other method of manufacturing a semiconductor device according to the present embodiment includes a groove forming step of forming a groove, from the side of the second surface of the semiconductor substrate, opposite to the first surface, to prevent exposure of a first conductive layer (electrode portion) and the adhesive layer between the semiconductor substrate and the support substrate. Thus, the method of manufacturing a semiconductor device can be provided in which the stress relief groove is formed in addition to the hole for a through-via, and by which the warpage of the semiconductor substrate can be inhibited while preventing moisture absorption from the adhesive layer to improve the yield.

Note that, in the above description, a second conductive layer (etching stopper layer) between the semiconductor substrate and the support substrate is formed to be exposed from a bottom of the stress relief groove, in the groove forming step, but the stress relief groove is preferably formed to reach the interlayer insulating layer between the semiconductor substrate and the adhesive layer. Furthermore, in FIG. 1, the adhesive layer is formed over the first surface of the semiconductor substrate, but the adhesive layer is preferably formed at least in the scribe area in the first surface of the semiconductor substrate.

(Second Embodiment)

Next, a semiconductor device according to a second embodiment will be described with reference to FIGS. 3 and 4A to 4H. In the present embodiment, a description will be made of a method of forming a hole for a through-via simultaneously with formation of the stress relief groove 61. Hereinafter, a difference from the first embodiment will be mainly described.

Figure 3:
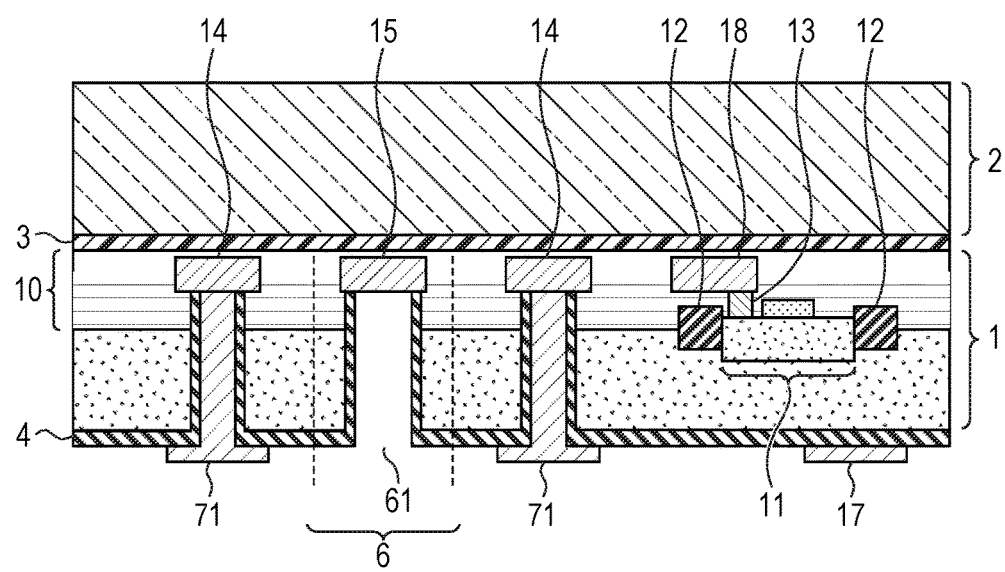
FIG. 3 is a schematic diagram illustrating a cross-sectional structure of a semiconductor device according to a second embodiment.

FIG. 3 is a schematic diagram illustrating a cross-sectional structure of the semiconductor device according to the second embodiment. The semiconductor device according to the present embodiment illustrated in FIG. 3 has a configuration the same as that of the semiconductor device illustrated in FIG. 1, except that the semiconductor device according to the present embodiment includes a through-via 71. Hereinafter, a method of manufacturing a semiconductor device illustrated in FIG. 3 will be described with reference to FIGS. 4A to 4H. In the following steps, a known semiconductor manufacturing process can be used as necessary, and between steps, heat treatment, cleaning, or the like can be performed. Description of a known technology may be sometimes omitted.

Figure 4A:
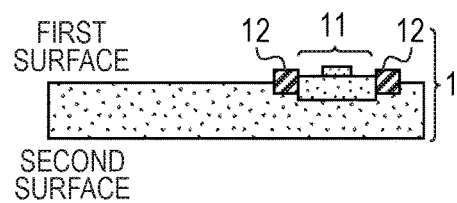
FIGS. 4A, 4B, 4C, 4D, 4E, 4F, 4G and 4H are schematic diagrams illustrating a method of manufacturing a semiconductor device according to the second embodiment.
Figure 4E:
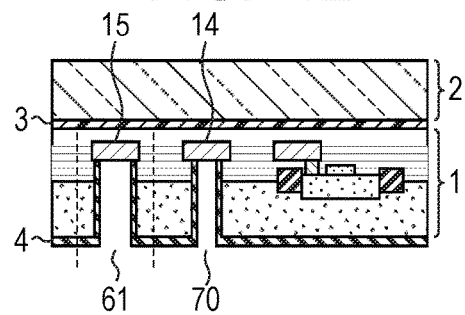
Figure 4B:
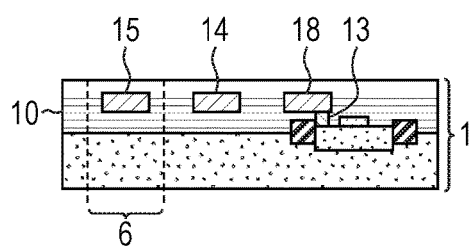
Figure 4F:
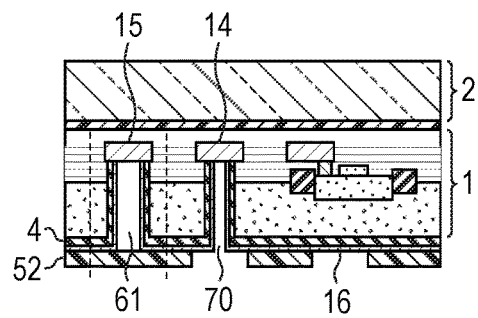
Figure 4C:
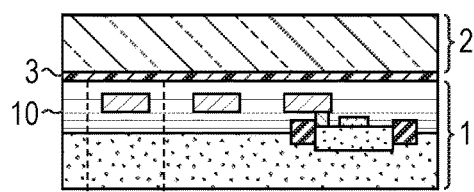

Steps illustrated in FIGS. 4A to 4C are the same as the steps of the first embodiment illustrated in FIGS. 2A to 2C, and description thereof will be omitted.

Figure 4G:
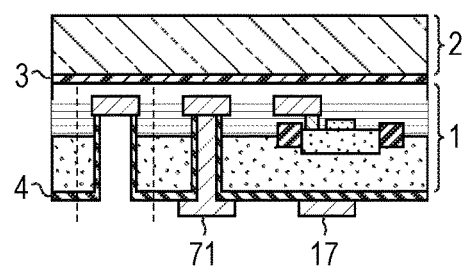
Figure 4D:
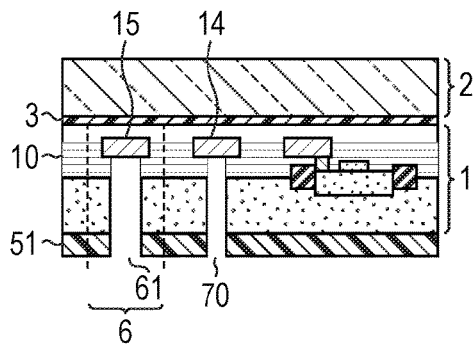

FIG. 4D is a schematic diagram illustrating a step of forming the stress relief groove 61 and a hole 70 in the semiconductor substrate 1, in the method of manufacturing a semiconductor device according to the second embodiment. In the step illustrated in FIG. 4D, after a pattern of the first mask 51 is formed on the second surface of the semiconductor substrate 1, etching is performed from a side of the second surface of the semiconductor substrate 1 to form the stress relief groove 61 and the hole 70.

Since the semiconductor device according to the present embodiment includes the etching stopper layer 15 in the interlayer insulating layer 10, the stress relief groove 61 is formed from the second surface of the semiconductor substrate 1 to the etching stopper layer 15. Similarly, since the semiconductor device according to the present embodiment includes the electrode portion 14 also used as an etching stopper layer 15, the hole 70 is formed from the second surface of the semiconductor substrate 1 to the electrode portion 14. Thus, the warpage of the semiconductor substrate 1 can be inhibited while preventing moisture absorption from the adhesive layer 3, and the yield can be improved. The stress relief groove 61 can be also used as a scribe groove.

In the present example, before the stress relief groove 61 reached the interlayer insulating layer 10, a so-called Bosch process was used to vertically etch the semiconductor substrate 1. After the stress relief groove 61 reached the depth of the interlayer insulating layer 10, the interlayer insulating layer 10 was subjected to dry etching to extend the stress relief groove 61 to the etching stopper layer 15. At this time, for the dry etching of the interlayer insulating layer 10 anisotropic etching, such as capacitive coupled plasma RIE, using a mixed gas including $CF_4$, $C_4F_8$, $O_2$, Ar, or the like was employed. In addition, the hole 70 was formed to the electrode portion 14 using the similar manner. In the present example, in order to simplify the method of manufacturing a semiconductor device, the stress relief groove 61 and the hole 70 were formed on the semiconductor substrate 1 using the same mask. Furthermore, in the present example, a resist was used as the first mask 51 to readily remove the first mask 51 later, but, as the first mask 51, for example, an inorganic substance or the like may be employed.

FIG. 4E is a schematic diagram illustrating a step of forming the insulating film 4 on the semiconductor substrate 1, in the method of manufacturing a semiconductor device according to the second embodiment. In the step illustrated in FIG. 4E, the insulating film 4 is formed over the second surface of the semiconductor substrate 1, including side surfaces of the stress relief groove 61 and the hole 70. As the insulating film 4, an insulating material, such as silicon oxide or silicon nitride, may be used.

In the present example, the insulating film 4 of silicon oxide having a thickness of 1.5 μm was formed on the second surface of the semiconductor substrate 1 by plasma CVD. Then, an insulating film 4 on the etching stopper layer 15 and the electrode portion 14 were removed by etch back using anisotropic etching, such as capacitive coupled plasma RIE using a mixed gas including $CF_4$, $C_4F_8$, $O_2$, Ar, or the like.

FIG. 4F is a schematic diagram illustrating a step of forming a second mask 52 on the semiconductor substrate 1, in the method of manufacturing a semiconductor device according to the second embodiment. In the step illustrated in FIG. 4F, a metal layer 16 used as a barrier metal and a seed metal is formed on the insulating film 4, the etching stopper layer 15, and the electrode portion 14, by sputtering method or the like, and the second mask 52 is formed thereon. The second mask 52 is formed to be applied to the stress relief groove 61, and not to be applied to the hole 70. Thus, in a subsequent step illustrated in FIG. 4G, the stress relief groove 61 is prevented from being filled with a conductive material.

In the present example, sputtering method was used to form the metal layer 16 from titanium, as a barrier metal layer, and the metal layer 16 from copper, as a seed metal layer. Furthermore, the second mask 52 was formed as a resist so as to be readily removed in a subsequent step illustrated in FIG. 4G.

FIG. 4G is a schematic diagram illustrating a step of forming the through-via 71 in the semiconductor substrate 1, in the method of manufacturing a semiconductor device according to the second embodiment. In the step illustrated in FIG. 4G, a conductive material is filled (plated) in the metal layer 16 which is patterned to form the through-via 71 in the hole 70 and the metal wire 17 on the insulating film 4. Then, the second mask 52 is removed, and the metal layer 16 remaining in areas in which the conductive material is not filled is removed by wet etching or the like.

Figure 4H:
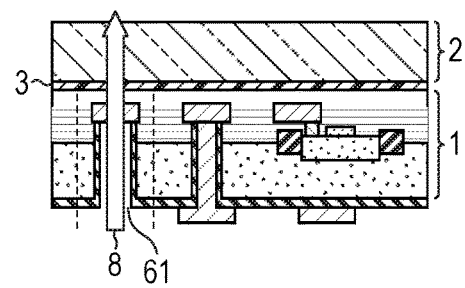

FIG. 4H is a schematic diagram illustrating a dicing step, in the method of manufacturing a semiconductor device according to the second embodiment. In the step illustrated in FIG. 4H, a known semiconductor manufacturing process is used to perform application of a solder resist and arrangement of a solder ball, and perform the step of dicing 8 or the like along the stress relief groove 61 also used as the scribe groove, and manufacture of the semiconductor device is completed.

As described above, the method of manufacturing a semiconductor device according to the present embodiment includes a bonding step of bonding the semiconductor substrate having a semiconductor element disposed on the first surface to the support substrate at least through the adhesive layer. Furthermore, a groove forming step forming a groove, from the side of the second surface of the semiconductor substrate, opposite to the first surface, to prevent exposure of the adhesive layer. Furthermore, the method of manufacturing a semiconductor device according to the present embodiment includes a step of forming a through-via by filling a conductive material in a hole disposed in the semiconductor substrate, after masking the groove. Thus, the warpage of the semiconductor substrate can be inhibited while preventing moisture absorption from the adhesive layer, and the yield can be improved, and further, the through-via can be formed while forming the stress relief groove.

(Third Embodiment)

Next, a semiconductor device according to a third embodiment will be described with reference to FIGS. 5 and 6A to 6I. In the present embodiment, a description will be made of a method of forming the stress relief groove 61 and the hole 70 to prevent exposure of the adhesive layer 3, using a difference in etching rate according to the areas of the stress relief groove 61 and the hole 70. Hereinafter, a difference from the second embodiment will be mainly described.

Figure 5:
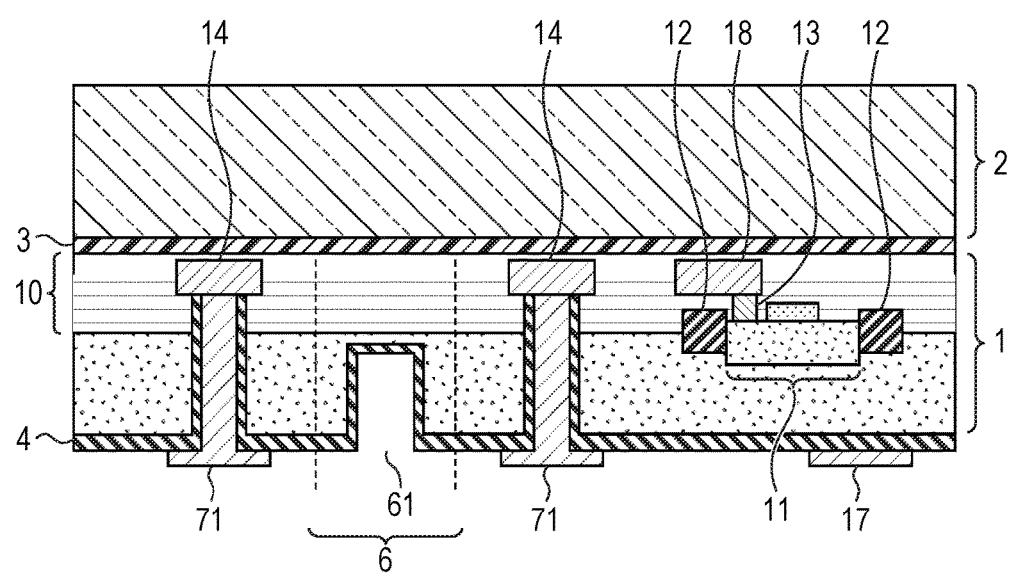
FIG. 5 is a schematic diagram illustrating a cross-sectional structure of a semiconductor device according to a third embodiment.

FIG. 5 is a schematic diagram illustrating a cross-sectional structure of the semiconductor device according to the third embodiment. The semiconductor device according to the present embodiment illustrated in FIG. 5 has a configuration the same as that of the semiconductor device illustrated in FIG. 3, except that the semiconductor device according to the present embodiment has no etching stopper layer 15 in the interlayer insulating layer 10. Hereinafter, a method of manufacturing a semiconductor device illustrated in FIG. 5 will be described with reference to FIGS. 6A to 6I. In the following steps, a known semiconductor manufacturing process can be used as necessary, and between steps, heat treatment, cleaning, or the like can be performed. Description of a known technology may be sometimes omitted.

Figure 6A:
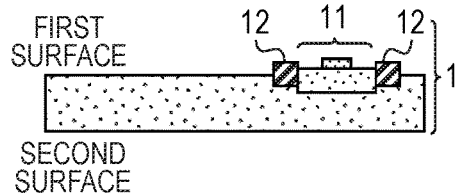
FIGS. 6A, 6B, 6C, 6D, 6E, 6F, 6G, 6H and 6I are schematic diagrams illustrating a method of manufacturing a semiconductor device according to the third embodiment.
Figure 6B:
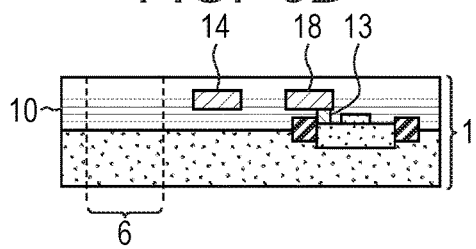
Figure 6C:
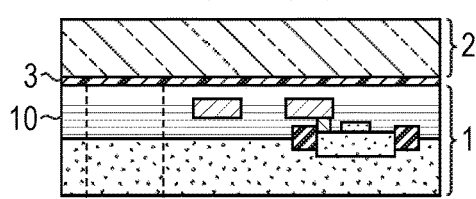

Steps illustrated in FIGS. 6A to 6C is the same as the steps of the second embodiment illustrated in FIGS. 4A to 4C, except that no etching stopper layer 15 is provided in the interlayer insulating layer 10. In the present embodiment, the step of forming the etching stopper layer 15 in the interlayer insulating layer 10 is omitted, and the method of manufacturing a semiconductor device can be simplified.

Figure 6D:
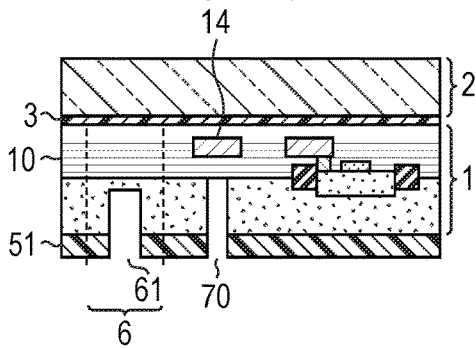
Figure 6E:
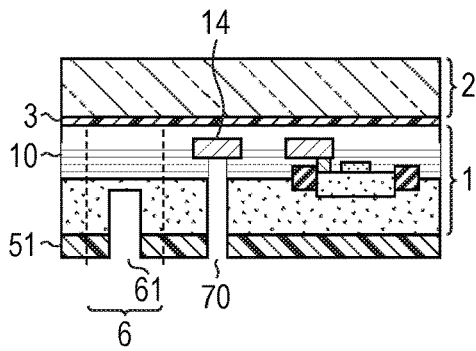

FIGS. 6D and 6E are schematic diagrams illustrating steps of forming the stress relief groove 61 and the hole 70 in the semiconductor substrate 1, in the method of manufacturing a semiconductor device according to the third embodiment. In a step illustrated in FIG. 6D, after a pattern of the first mask 51 is formed on the second surface of the semiconductor substrate 1, etching is performed from a side of the second surface of the semiconductor substrate 1 to form the stress relief groove 61 and the hole 70. In this configuration, the semiconductor device according to the present embodiment has no etching stopper layer 15 in the interlayer insulating layer 10, but a difference in etching rate between the stress relief groove 61 and the hole 70 is used to form the stress relief groove 61 to prevent exposure of the adhesive layer 3.

Specifically, the decrease in etching rate with increasing pattern area of the first mask 51 is used to form the stress relief groove 61 having a relatively large pattern area shallower than the hole 70 having a relatively small pattern area. Thus, since the stress relief groove 61 and the hole 70 are formed to prevent exposure of the adhesive layer 3, the warpage of the semiconductor substrate 1 can be inhibited while preventing moisture absorption from the adhesive layer 3, and the yield can be improved.

In the present example, as illustrated in FIG. 6D, so-called Bosch process was used first to vertically etch the semiconductor substrate 1, before the hole 70 reached the interlayer insulating layer 10. Meanwhile, the stress relief groove 61 was etched shallower than the hole 70 so as not to reach the interlayer insulating layer 10, using a difference in etching rate according to the area.

Next, as illustrated in FIG. 6E, anisotropic etching, such as capacitive coupled plasma RIE, using a mixed gas including $CF_4$, $C_4F_8$, $O_2$, Ar, or the like was employed to subject the interlayer insulating layer 10 to dry etching to extend the hole 70 to the electrode portion 14. Meanwhile, since a Si layer remained in the stress relief groove 61, the stress relief groove 61 was not etched further. Therefore, as illustrated in FIG. 6E, the stress relief groove 61 and the hole 70 were formed to prevent exposure of the adhesive layer 3.

Figure 6F:
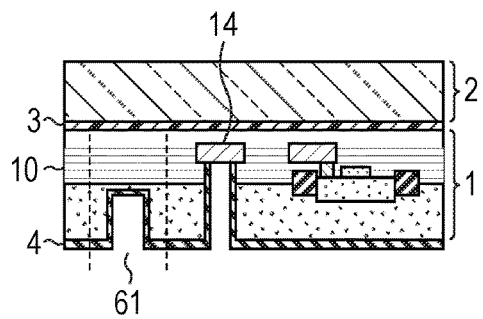
Figure 6G:
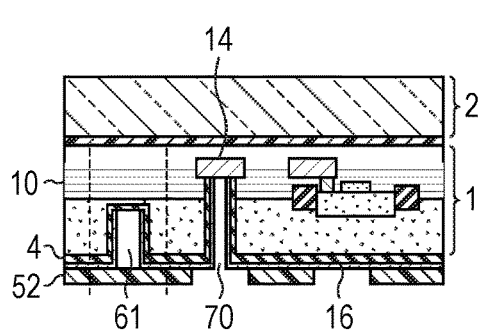
Figure 6H:
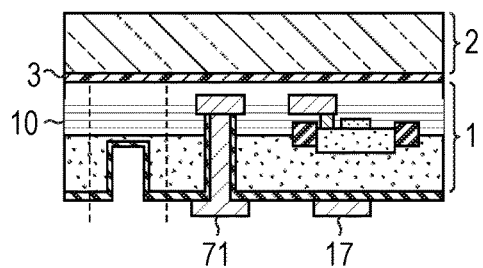

Steps illustrated in FIGS. 6F to 6H are the same as the steps of the second embodiment illustrated in FIGS. 4E to 4G, except that no etching stopper layer 15 is provided and the stress relief groove 61 is formed not to reach the interlayer insulating layer 10, and thus, description thereof will be omitted.

Figure 6I:
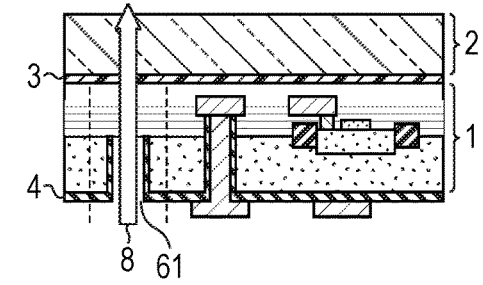

FIG. 6I is a schematic diagram illustrating a dicing step, in the method of manufacturing a semiconductor device according to the third embodiment. The Si layer remaining in the stress relief groove 61 which is also used as the scribe groove brings about abrasion of a dicing blade and causes chipping such as breaking or cracking. Therefore, after the insulating film 4 in the stress relief groove 61 is etched, the Si layer remaining in the stress relief groove 61 is removed. Then, a step of dicing 8 or the like is performed along the stress relief groove 61 which is also used as the scribe groove, and manufacture of the semiconductor device is completed.

As described above, in the method of manufacturing a semiconductor device according to the present embodiment, a difference in etching rate according to the pattern area of the mask is used to form a groove (stress relief groove) having a relatively large area shallower than a hole having a relatively small area. Thus, effects similar to those of the second embodiment can be obtained, and the method of manufacturing a semiconductor device can be simplified.

(Fourth Embodiment)

Next, a semiconductor device according to a fourth embodiment will be described with reference to FIGS. 7 and 8A to 8I. In the present embodiment, a method of removing the etching stopper layer 15 upon performance of the dicing step will be described. Hereinafter, a difference from the second embodiment will be mainly described.

Figure 7:
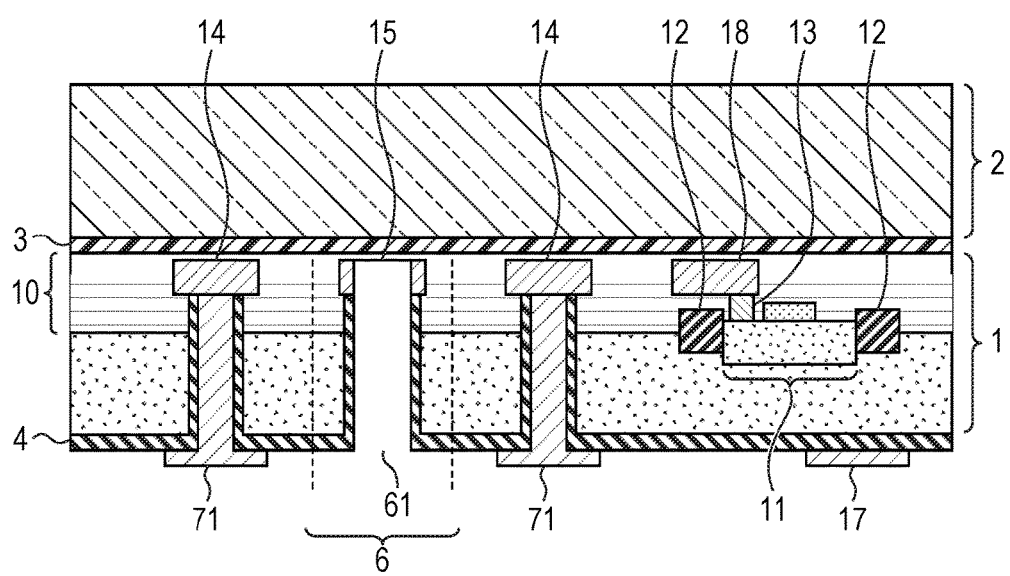
FIG. 7 is a schematic diagram illustrating a cross-sectional structure of a semiconductor device according to a fourth embodiment.

FIG. 7 is a schematic diagram illustrating a cross-sectional structure of the semiconductor device according to the fourth embodiment. The semiconductor device according to the present embodiment illustrated in FIG. 7 has a configuration the same as that of the semiconductor device illustrated in FIG. 3, except that the etching stopper layer 15 is removed from the semiconductor device according to the present embodiment. Hereinafter, a method of manufacturing a semiconductor device illustrated in FIG. 7 will be described with reference to FIGS. 8A to 8I. In the following steps, a known semiconductor manufacturing process can be used as necessary, and between steps, heat treatment, cleaning, or the like can be performed. Description of a known technology may be sometimes omitted.

Steps illustrated in FIGS. 8A to 8D is the same as the steps of the second embodiment illustrated in FIGS. 4A to 4D, and description thereof will be omitted. Note that in the present embodiment, the etching stopper layer 15 is removed in a subsequent step illustrated in FIG. 8E, so that the etching stopper layer 15 is preferably formed in a deeper area (near the first surface of the semiconductor substrate 1) as much as possible.

FIG. 8E is a schematic diagram illustrating the step of removing the etching stopper layer 15, in the method of manufacturing a semiconductor device according to the third embodiment. In the step illustrated in FIG. 8E, the etching stopper layer 15 in the scribe area 6 is removed by wet etching. At this time, when the etching stopper layer 15 and the wiring layer 18 are formed of different materials beforehand, only the etching stopper layer 15 can be readily removed without influencing the wiring layer 18 and the electrode portion 14.

For example, the etching stopper layer 15 is formed of copper and the wiring layer 18 and the electrode portion 14 are formed of aluminum beforehand, and only the etching stopper layer 15 formed of copper is removed by wet etching. As described above, the etching stopper layer 15 can be removed by etching process (wet etching) different from etching process (e.g., dry etching) used for forming the stress relief groove 61. Note that the difference of etching process also includes the change of etchant.

Steps illustrated in FIGS. 8F to 8H is the same as the steps of the second embodiment illustrated in FIGS. 4E to 4G, except that the etching stopper layer 15 is removed, and description thereof will be omitted.

FIG. 8I is a schematic diagram illustrating a dicing step, in the method of manufacturing a semiconductor device according to the third embodiment. The etching stopper layer 15 remaining in the stress relief groove 61 which is also used as the scribe groove brings about abrasion of a dicing blade and causes chipping such as breaking or cracking. Therefore, after a bottom insulating film is etched, the etching stopper layer 15 in the stress relief groove 61 is removed. Then, the step of dicing or the like is performed along the stress relief groove 61 which is also used as the scribe groove, and manufacture of the semiconductor device is completed.

As described above, the method of manufacturing a semiconductor device according to the present embodiment includes a step of removing the second conductive layer (etching stopper layer) exposed from a bottom surface of the stress relief groove, after the groove forming step forming the stress relief groove, and before the dicing step performing dicing along the stress relief groove. Thus, effects similar to those of the second embodiment can be obtained, and chipping such as breaking or cracking of the semiconductor device can be inhibited.

(Other Embodiments)

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-189209, filed Sep. 28, 2016, which is hereby incorporated by reference herein in its entirety.

What is claimed is:

1. A method of manufacturing a semiconductor device, the method comprising:
    bonding a semiconductor substrate having a semiconductor element and a conductive layer disposed on a first surface, to a support substrate, at least through an adhesive layer between the semiconductor substrate and the support substrate, the semiconductor substrate including chip areas and a scribe area between the chip areas;
    forming a groove in the scribe area of the semiconductor substrate, from a side of a second surface of the semiconductor substrate, the second surface being opposite to the first surface; and
    dicing the semiconductor substrate into chips by cutting the semiconductor substrate in the scribe area along the groove, such that the chips include the chip areas but do not include the scribe area,
    wherein, in the forming the groove, the conductive layer between the semiconductor substrate and the support substrate is exposed at a bottom of the groove, without the adhesive layer being exposed in the groove.

2. The method according to claim 1, wherein, in the forming the groove, the groove is formed to reach an insulating layer between the semiconductor substrate and the adhesive layer.

3. The method according to claim 1, further comprising removing a layer exposed from a bottom surface of the groove by an etching process different from an etching process used for forming the groove, after the forming the groove and before the dicing.

4. The method according to claim 1, wherein, in the forming the groove, a hole for a through-via is formed in the semiconductor substrate, together with the groove.

5. The method according to claim 1, wherein a hole for a through-via is formed before or after the forming the groove.

6. The method according to claim 4, further comprising:
    forming the hole from the second surface of the semiconductor substrate to an electrode portion between the semiconductor substrate and the support substrate, in the forming the groove; and
    forming the through-via connected to the electrode portion by disposing a conductive material in the hole, after masking the groove.

7. The method according to claim 1, further comprising cleaning the second surface of the semiconductor substrate after the forming the groove,
    wherein side surfaces of the groove are positioned in the scribe area.

8. A method of manufacturing a semiconductor device, the method comprising:
    bonding a semiconductor substrate having a semiconductor element and an insulating layer disposed on a first surface, to a support substrate, at least through an adhesive layer between the semiconductor substrate and the support substrate, the semiconductor substrate including chip areas and a scribe area between the chip areas; and
    forming a groove in the scribe area from a side of a second surface of the semiconductor substrate, the second surface being opposite to the first surface; and
    dicing the semiconductor substrate into chips by cutting the semiconductor substrate in the scribe area, such that the chips include the chip areas but do not include the scribe area,
    wherein, in the forming the groove, the groove is formed to reach the insulating layer between the semiconductor substrate and the adhesive layer, without the adhesive layer being exposed in the groove.

9. The method according to claim 8, wherein, in the forming the groove, a difference in etching rate according to a pattern area of a mask is used to form a hole for a through-via from the second surface of the semiconductor substrate to an electrode portion for the through-via, and form the groove having a larger area than the hole and being shallower than the hole.

10. The method according to claim 8, wherein, in the forming the groove, a hole for a through-via is formed in the semiconductor substrate, together with the groove.

11. The method according to claim 8, wherein a hole for a through-via is formed before or after the forming the groove.

12. The method according to claim 11, further comprising:
    forming the hole from the second surface of the semiconductor substrate to an electrode portion between the semiconductor substrate and the support substrate, in the forming the groove; and
    forming the through-via connected to the electrode portion by disposing a conductive material in the hole, after masking the groove.

13. The method according to claim 8, further comprising cleaning the second surface of the semiconductor substrate after the forming the groove,
    wherein side surfaces of the groove are positioned in the scribe area.

* * * * *